(12) United States Patent
Cho

(10) Patent No.: US 9,299,280 B2
(45) Date of Patent: Mar. 29, 2016

(54) SUBSTRATE OF ELECTRONIC DEVICE, ELECTRONIC DEVICE INCLUDING THE SAME, AND MEASURING METHOD OF RESISTANCE AT CONNECTION PORTION

(71) Applicant: Samsung Display Co., Ltd., Yongin (KR)

(72) Inventor: Won-Gu Cho, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 323 days.

(21) Appl. No.: 14/013,893

(22) Filed: Aug. 29, 2013

(65) Prior Publication Data

US 2014/0327459 A1   Nov. 6, 2014

(30) Foreign Application Priority Data

May 6, 2013 (KR) ........................ 10-2013-0050767

(51) Int. Cl.
| | |
|---|---|
| *G01R 27/08* | (2006.01) |
| *G01R 27/14* | (2006.01) |
| *G09G 3/00* | (2006.01) |
| *G01R 27/02* | (2006.01) |
| *G01R 31/04* | (2006.01) |

(52) U.S. Cl.
CPC ............... *G09G 3/006* (2013.01); *G01R 27/02* (2013.01); *G01R 27/08* (2013.01); *G01R 27/14* (2013.01); *G01R 31/046* (2013.01); *H01L 2224/11* (2013.01)

(58) Field of Classification Search
CPC .... G09G 3/00; G01R 31/046; G01R 31/2831; G01R 31/309; G01R 31/3274; G01R 31/3278; G01R 27/02; G01R 27/08; G01R 27/14; H01L 22/00; H01L 22/10; H01L 22/12; H01L 22/14; H01L 22/30; H01L 22/32; H01L 22/34; H01L 2224/11

USPC ........... 324/713, 691, 649, 600, 537, 756.01, 324/756.07, 757.01, 757.02, 763.01
See application file for complete search history.

(56) References Cited

U.S. PATENT DOCUMENTS

| | | | | | |
|---|---|---|---|---|---|
| 4,714,874 A | * | 12/1987 | Morris | ................. | G01N 27/041 324/444 |
| 5,115,200 A | * | 5/1992 | Lahitte | ................. | G01N 27/20 324/691 |
| 5,272,445 A | * | 12/1993 | Lloyd | ................. | G01R 17/105 324/705 |
| 5,640,097 A | * | 6/1997 | Hada | ................. | G01R 31/2648 324/713 |

(Continued)

FOREIGN PATENT DOCUMENTS

| | | |
|---|---|---|
| JP | 06-289075 | 10/1994 |
| KR | 10-2011-0060249 | 6/2011 |
| KR | 10-2012-0073765 | 7/2012 |

*Primary Examiner* — Hoai-An D Nguyen
(74) *Attorney, Agent, or Firm* — H.C. Park & Associates, PLC

(57) ABSTRACT

A substrate of an electronic device may include a first test region and a second test region to measure resistance at a connection portion. The first test region and the second test region each includes a plurality of measuring pad portions, a protective layer disposed on the plurality of measuring pad portions, and a contact assistance member disposed on the protective layer. The protective layer in the first test region includes a first contact hole exposing the plurality of measuring pad portions. The contact assistance member in the first test region contacts the measuring pad portion exposed through the first contact hole. The protective layer in the second test region includes two second contact holes exposing one measuring pad portion, and the contact assistance member in the second test region contacts the one measuring pad portion through the two second contact holes.

27 Claims, 12 Drawing Sheets

(56) References Cited

U.S. PATENT DOCUMENTS

| | | | |
|---|---|---|---|
| 6,335,626 B1 * | 1/2002 | Motulla | G01N 27/041 205/125 |
| 7,405,578 B2 * | 7/2008 | Mikael | G01N 27/041 324/525 |
| 8,471,567 B2 * | 6/2013 | Clarkson | G01R 31/048 324/522 |
| 2002/0190733 A1 * | 12/2002 | Kinoshita | G01F 1/6842 324/713 |
| 2004/0268275 A1 * | 12/2004 | Cappelletti | G01R 31/2853 324/762.06 |
| 2007/0080697 A1 * | 4/2007 | Tseng | G01R 27/205 324/691 |
| 2008/0211512 A1 * | 9/2008 | Czech | G01R 31/2853 324/537 |
| 2010/0253372 A1 * | 10/2010 | Rousseville | G01R 31/046 324/705 |
| 2012/0161805 A1 | 6/2012 | Jung et al. | |
| 2013/0207736 A1 * | 8/2013 | Lee | G01R 27/02 333/17.3 |

* cited by examiner

SUBSTRATE OF ELECTRONIC DEVICE, ELECTRONIC DEVICE INCLUDING THE SAME, AND MEASURING METHOD OF RESISTANCE AT CONNECTION PORTION

CROSS REFERENCE TO RELATED APPLICATION

This application claims priority from and the benefit of Korean Patent Application No. 10-2013-0050767 filed on May 6, 2013, which is hereby incorporated by reference for all purposes as if fully set forth herein.

BACKGROUND OF THE INVENTION

1. Field of the Invention

Exemplary embodiment of the present invention relate to a substrate of an electronic device, an electronic device including the substrate, and a measuring method of resistance at a connection portion.

2. Discussion of the Background

An electronic device, such as a display device, may include a substrate where a plurality of signal lines, electrodes, and thin film transistors are formed, and a driving circuit supplying a driving signal to the signal lines. The driving circuit may constitute an integrated circuit (IC) chip. The driving circuit may be mounted to the substrate of the electronic device or a flexible printed circuit (FPC) through various methods. For example, the driving circuit may be mounted on the substrate of the electronic device as a type of at least one integrated circuit chip (a chip on glass (COG) type), or may be mounted or integrated on a film such as a flexible printed circuit film (FPC) in which a plurality of conductive lead lines are formed on an insulating film such as a polyimide (a chip on film (COF) type) to be adhered to the substrate of the electronic device as a type of a tape carrier package (TCP).

Among processes for connecting the driving circuit chip of the COG type, or the film of the TCP type, and the substrate of the electronic device, a process of electrically connecting a pad portion of the signal line of the substrate and a driving circuit chip of the COG type or an output terminal of the TCP is referred to as an OLB process, that is, an outer lead bonding process. The driving circuit chip of the COG type, or the output terminal of the TCP type film, and the pad portion of the signal line of the substrate may contact each other by interposing an anisotropic conductive film (ACF).

Resistance of a connection portion of the driving circuit chip of the COG type, or the output terminal of the TCP type film, and the pad portion of the signal line of the substrate may include contact resistance between multi-layered thin films of the substrate and connection resistance between the driving circuit chip of the COG type, or the output terminal of the TCP type film, and the pad portion of the signal line of the substrate. The contact resistance in the connection portion may be determined by a material of the thin films that contact up and down or an interface characteristic therebetween, and the connection resistance may be determined by the anisotropic conductive layer and process conditions.

The resistance of the connection portion may be very important to normally drive the electronic device, and may be one of factors that cause a driving defect in a manufacturing process. If the resistance of the connection portion is high, distortion may be generated in a driving signal transmitted to the substrate of the electronic device such that the electronic device may be abnormally operated or an error may be generated in current consumption, manufacturing cost and manufacturing time may be increased, and yield may be decreased.

SUMMARY OF THE INVENTION

Exemplary embodiments of the present invention provide a pad portion capable of correctly measuring resistances for different sorts at a connection portion between a substrate of an electronic device and a driving circuit chip or a TCP type film without additional analysis, a substrate including the same, and a resistance measuring method using the same.

Additional features of the invention will be set forth in the description which follows, and in part will be apparent from the description, or may be learned by practice of the invention.

Exemplary embodiments of the present invention provide a substrate of an electronic device, including a first test region and a second test region to measure resistance at a connection portion for connection to a driving circuit portion. The first test region and the second test region include a plurality of measuring pad portions, a protective layer disposed on the plurality of measuring pad portions, and a contact assistance member disposed on the protective layer. The protective layer in the first test region includes a first contact hole exposing the plurality of measuring pad portions, and the contact assistance member in the first test region contacts the measuring pad portion exposed through the first contact hole. The protective layer in the second test region includes two second contact holes exposing one measuring pad portion among the plurality of measuring pad portions, and the contact assistance member in the second test region contacts the measuring pad portion exposed through the two second contact holes.

Exemplary embodiments of the present invention also provide an electronic device including a substrate comprising a first test region and a second test region to measure resistance at a connection portion, and a driving circuit portion including a plurality of conductive bumps and a conductive pattern connected to the conductive bumps. The driving circuit portion is connected to the connection portion. The first test region and the second test region include a plurality of measuring pad portions, a protective layer disposed on the plurality of measuring pad portions, and a contact assistance member disposed on the protective layer. The protective layer in the first test region includes a first contact hole exposing at least one measuring pad portion among the plurality of measuring pad portions, and the contact assistance member in the first test region contacts the measuring pad portion exposed through the first contact hole. The protective layer in the second test region comprises two second contact holes exposing one measuring pad portion among the plurality of measuring pad portions and the contact assistance member of the second test region contacts the measuring pad portion exposed through the two second contact holes.

Exemplary embodiments of the present invention also provide a method of measuring a resistance at a connection portion, including providing a substrate comprising a first test region and a second test region, connecting a driving circuit portion to a connection portion of the substrate, supplying a current to the first test region and measuring a voltage to measure a first resistance, and supplying a current to the second test region and measuring a voltage to measure a second resistance which is a different from the first resistance.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
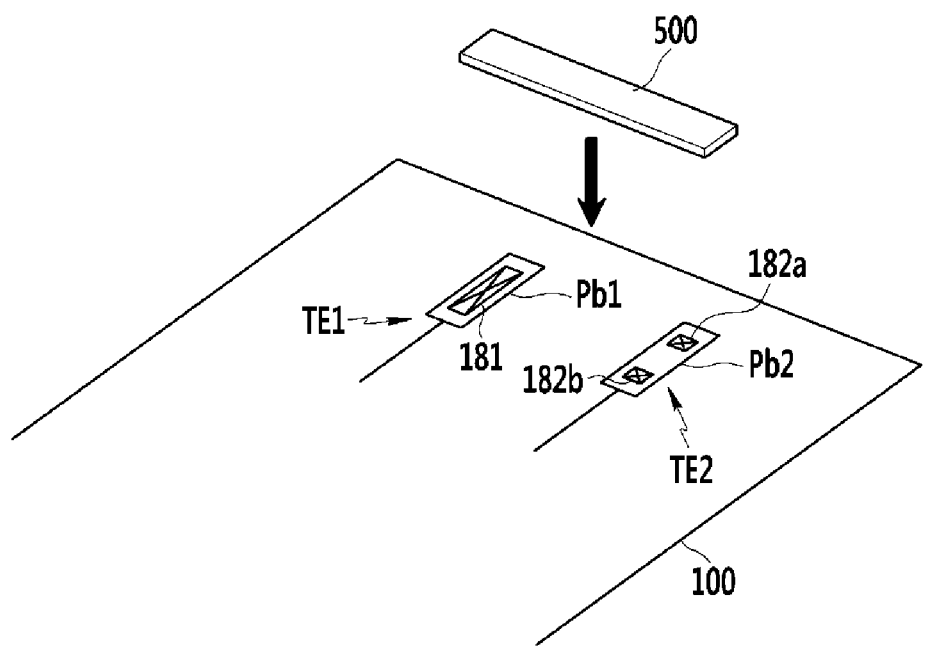
FIG. 1 is an exploded perspective view of a substrate and a driving circuit portion of an electronic device according to exemplary embodiments of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It may also be understood that for the purposes of this disclosure, "at least one of X, Y, and Z" can be construed as X only, Y only, Z only, or any combination of two or more items X, Y, and Z (e.g., XYZ, XYY, YZ, ZZ).

Hereinafter, exemplary embodiments of the present invention are described in detail with reference to the accompanying drawings.

Referring to FIG. 1, a substrate of an electronic device including a pad portion will be described.

FIG. 1 is an exploded perspective view of a substrate and a driving circuit portion of an electronic device.

Referring to FIG. 1, a substrate 100 of an electronic device may include a plurality of driving signal lines (not shown) transmitting a driving signal and at least one thin film transistor (not shown). For example, the substrate 100 may be a thin film transistor display panel in which several electrodes, signal lines, and thin film transistors of the display device may be formed. The driving signal line may include a pad portion (not shown) as an end connected to an external device such as a driving circuit portion 500 to receive a driving signal. A connection portion between the pad portion and the external device, such as the driving circuit portion 500, is referred to as a connection portion, and the connection portion may be mainly positioned near the edge of the substrate 100.

The substrate 100 may include a first test region TE1 and a second test region TE2 to measure resistance in the connection portion. The first test region TE1 and the second test region TE2 may include a plurality of pad portions. The first test region TE1 may include a measuring pad portion Pb1, and the second test region TE2 may include a measuring pad portion Pb2. The measuring pad portions Pb1 and Pb2 included in the first test region TE1 and the second test region TE2 may be pad portions connected to the driving signal line, or pad portions that may not be connected to the driving signal line.

A protective layer (a passivation layer) (not shown) made of an insulating material may be positioned on the driving signal line and the measuring pad portions Pb1 and Pb2. The protective layer may include a first contact hole 181 exposing the measuring pad portion Pb1 of the first test region TE1, and second contact holes 182a and 182b exposing the measuring pad portion Pb2 of the second test region TE2 and separated into two or more having a different shape from the first contact hole 181. The shape may be a size or a position of the measuring pad portion Pb1 and measuring pad portion Pb2 of the corresponding constituent element.

On the measuring pad portion Pb1 of the first test region TE1 and the measuring pad portion Pb2 of the second test region TE2, contact assistance members (not shown) may be included on the measuring pad portion Pb1 and the measuring pad portion Pb2. Specifically, contact assistance members (not shown) may be connected to the measuring pad portion Pb1 through the first contact hole 181 and to the measuring pad portion Pb2 through the second contact holes 182a and 182b. The contact assistance members may supplement adhesion between the measuring pad portions Pb1 and Pb2 and the external device, such as the driving circuit portion 500, and protect them.

The measuring pad portion Pb1 of the first test region TE1 and the measuring pad portion Pb2 of the second test region TE2 may contact the driving circuit portion 500 to be electrically connected therewith. The driving circuit portion 500 may be a driving circuit chip (a chip on glass (COG)) of an integrated circuit (IC) chip shape, or a chip on film (COF) TCP (tape carrier package) in which the driving circuit may be integrated or the driving circuit chip may be mounted on a flexible printed circuit (FPC) film or a flexible printed circuit (FPC) board in which a plurality of conductive lead lines may be formed on an insulating film, for example, a polyimide. The driving circuit portion 500 may be connected to the substrate 100 of the electronic device such that the electronic device may be driven.

An anisotropic conductive film (ACF) (not shown) may be further positioned between the driving circuit portion 500 and the measuring pad portion Pb1 and measuring pad portion Pb2. The anisotropic conductive film may include a hard setting adhesive such as an adhesive resin with conductive balls. The anisotropic conductive film as an adhesion film may insulate in a direction that may be approximately parallel to the surface of the thin film transistor display panel, and may conduct in a direction that may be approximately perpendicular to the surface of the thin film transistor display panel.

The driving circuit portion 500 may include at least one conductive bump (not shown) connected to the measuring pad portion Pb1 and measuring pad portion Pb2 through the anisotropic conductive film. The conductive bump may function as an output terminal or an input terminal of the driving circuit portion 500. Neighboring conductive bumps of a predetermined number may be electrically connected inside the driving circuit portion 500.

The substrate of the electronic device including the pad portion will be described with reference to FIG. 1, FIG. 2, FIG. 3, FIG. 4, and FIG. 5.

Figure 2:
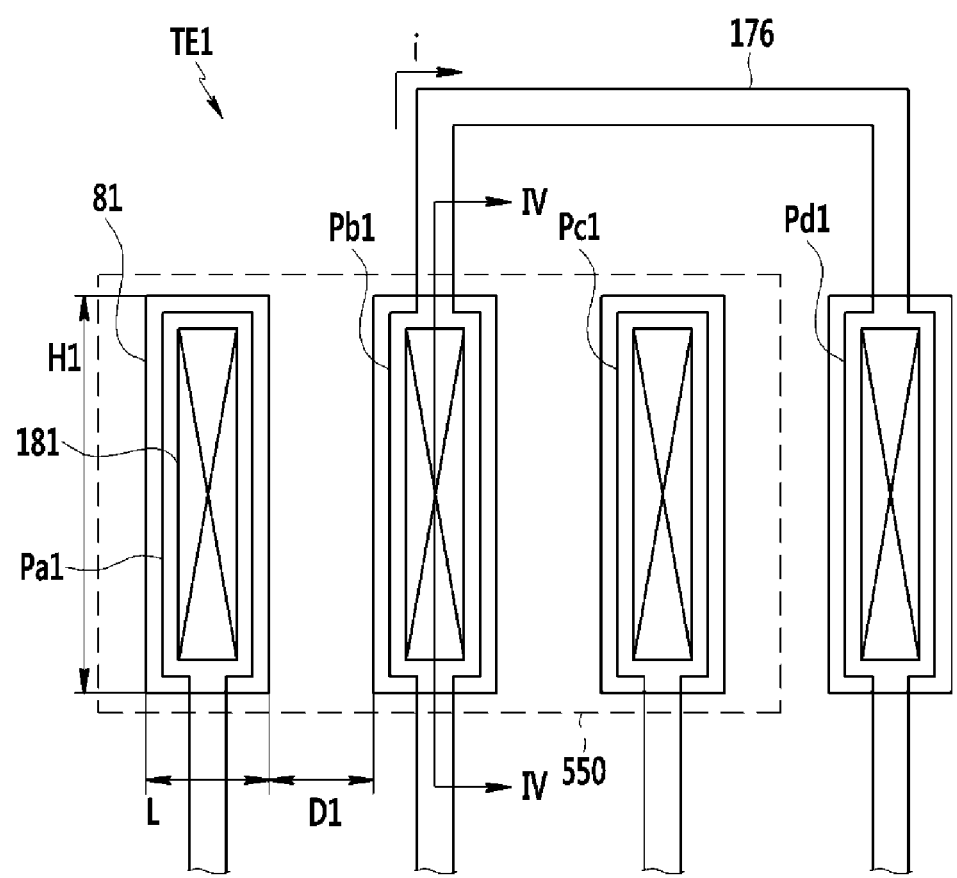
FIG. 2 and FIG. 3 are top plan views of a pad portion according to exemplary embodiments of the present invention.
Figure 3:
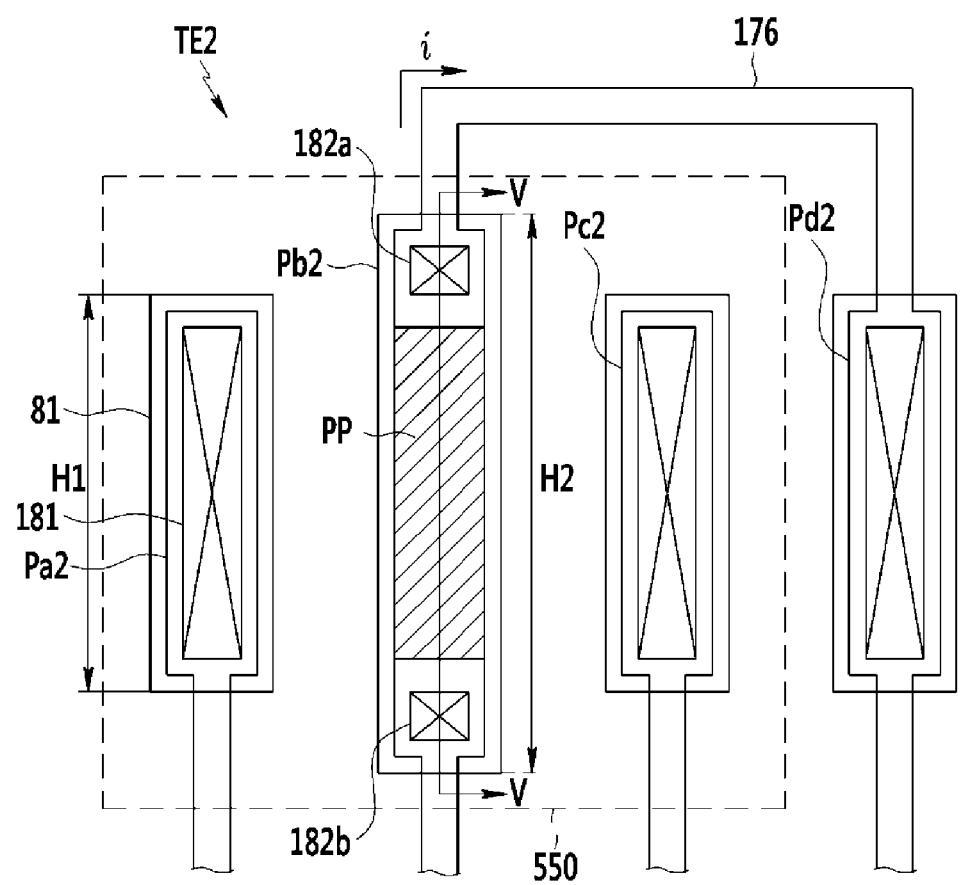
Figure 4:
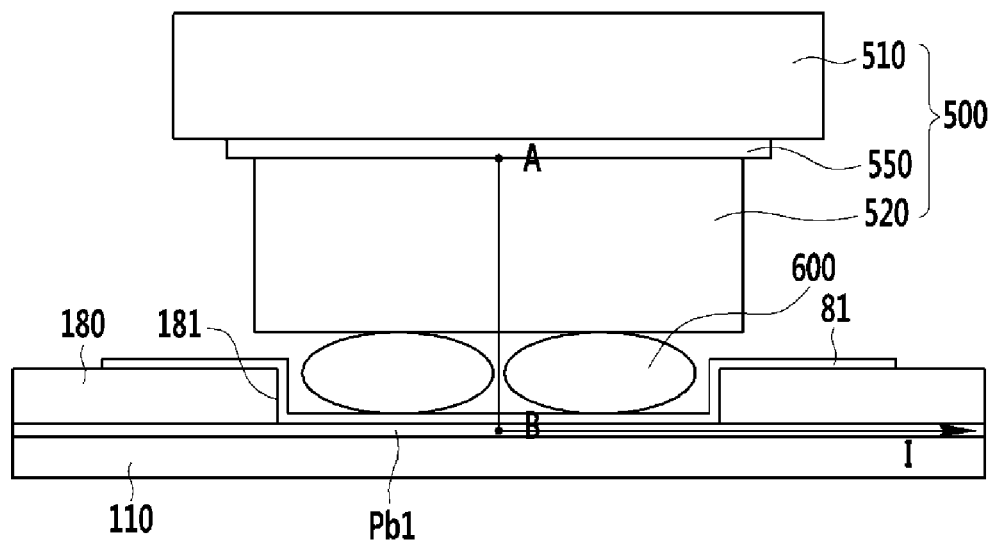
FIG. 4 is a cross-sectional view of the substrate shown in FIG. 2 taken along the line IV-IV according to exemplary embodiments of the present invention.
Figure 5:
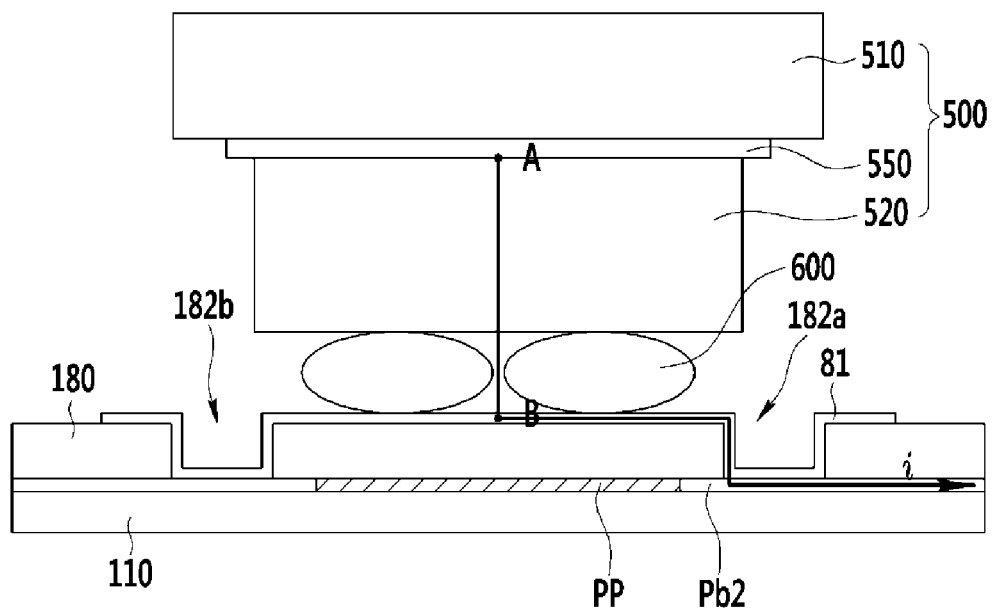
FIG. 5 is a cross-sectional view of the substrate shown in FIG. 3 taken along the line V-V according to exemplary embodiments of the present invention.

FIG. 2 and FIG. 3 are top plan views of a pad portion and FIG. 4 is a cross-sectional view of the substrate shown in FIG. 2 taken along the line IV-IV. FIG. 5 is a cross-sectional view of the substrate shown in FIG. 3 taken along the line V-V.

The first test region TE1 will be described with reference to FIG. 2 and FIG. 4.

The first test region TE1 of the electronic device may include four measuring pad portions Pa1, Pb1, Pc1, and Pd1 positioned on an insulation substrate 110 and the four measuring pad portions Pa1, Pb1, Pc1, and Pd1 may function as four terminals to measure resistance at the connection portion. The four measuring pad portions Pa1, Pb1, Pc1, and Pd1 may include a first measuring pad portion Pa1, a second measuring pad portion Pb1, a third measuring pad portion Pc1, and a fourth measuring pad portion Pd1. The four measuring pad portions Pa1, Pb1, Pc1, and Pd1 may have the same shape and/or size, and at least two of the measuring pad portions Pa1, Pb1, Pc1, and Pd1 may have a different shape and/or size.

The second measuring pad portion Pb1 and the fourth measuring pad portion Pd1 may be connected through a connection wire 176.

A protective layer 180 made of an insulating material may be positioned on the measuring pad portions Pa1, Pb1, Pc1, and Pd1. The protective layer 180 may include a plurality of first contact holes 181 respectively exposing the measuring pad portions Pa1, Pb1, Pc1, and Pd1 of the first test region TE1.

A plurality of contact assistance members 81 may be positioned on the protective layer 180. The contact assistance members 81 may contact the measuring pad portions Pa1, Pb1, Pc1, and Pd1 of the first test region TE1 through the first contact hole 181. A horizontal direction length L and a vertical direction length H1 of each contact assistance member 81 of the first test region TE1 and a distance D1 between the adjacent contact assistance members 81 may or may not be uniform.

Contact resistance may exist between the measuring pad portions Pa1, Pb1, Pc1, Pd1, the protective layer 180, and the contact assistance member 81 that may contact each other.

The contact assistance member 81 connected to the measuring pad portions Pa1, Pb1, Pc1, and Pd1 may be connected to the driving circuit portion 500. The driving circuit portion 500 may include a circuit board 510, a conductive pattern 550 positioned on the circuit board 510, and a conductive bump 520 connected to the conductive pattern 550.

The conductive pattern 550 may electrically connect a plurality of adjacent conductive bumps 520. A portion indicated by a dotted line in FIG. 2 may indicate measuring pad portions Pa1, Pb1, and Pc1 to be connected to the conductive bumps 520 that may be connected by the conductive pattern 550.

The conductive bumps 520 may be electrically connected to the contact assistance members 81 through conductive balls 600 of the anisotropic conductive layer.

In some cases, the contact resistance between the conductive balls 600 and the conductive bumps 520, the contact resistance between the conductive balls 600 and the contact assistance members 81, and the resistance of the conductive balls 600 may represent connection resistance at the connection portion.

As shown in FIG. 4, if the resistance between a point A of the conductive pattern 550 and a point B of the measuring pad portions Pa1, Pb1, Pc1, and Pd1 is measured, the resistance including the contact resistance between the multi-layered thin films on the insulation substrate 110, as well as the connection resistance at the connection portion, may be measured.

The second test region TE2 will be described with reference to FIG. 3 and FIG. 5.

The second test region TE2 of the electronic device may include four measuring pad portions Pa2, Pb2, Pc2, and Pd2 positioned on the insulation substrate 110 and may function as four terminals to measure the resistance at the connection portion. The four measuring pad portions Pa2, Pb2, Pc2, and Pd2 may include a first measuring pad portion Pa2, a second measuring pad portion Pb2, a third measuring pad portion Pc2, and a fourth measuring pad portion Pd2.

The second measuring pad portion Pb2 may have a different shape from the second measuring pad portion Pb1 of the first test region TE1 or the other measuring pad portions Pa2, Pc2, and Pd2 of the second test region TE2. FIG. 3 illustrates exemplary embodiments of the present invention in which a vertical direction length of the second measuring pad portion Pb2 of the second test region TE2 may be longer than a vertical direction length of the second measuring pad portion Pb1 of the first test region TE1 or the other measuring pad portions Pa2, Pc2, and Pd2 of the second test region TE2. However, the second measuring pad portion Pb2 of the second test region TE2 may have the same shape as the second measuring pad portion Pb1 of the first test region TE1 or the other measuring pad portions Pa2, Pc2, and Pd2 of the second test region TE2.

Referring to FIG. 3 and FIG. 5, a center portion PP of the second measuring pad portion Pb2 of the second test region TE2 may be removed, and in some cases, the second measuring pad portion Pb2 of the second test region TE2 may be divided into upper and lower portions.

The second measuring pad portion Pb2 of the second test region TE2 and the fourth measuring pad portion Pd2 may be connected through the connection wire 176.

The protective layer 180 may be positioned on the measuring pad portions Pa2, Pb2, Pc2, and Pd2. The protective layer 180 may include a plurality of the first contact holes 181 and second contact holes 182a and 182b. The first contact holes 181 may expose the first measuring pad portion Pa2, the third measuring pad portion Pc2, and the fourth measuring pad portion Pd2 of the second test region TE2, and the second contact holes 182a and 182b may expose the second measuring pad portion Pb2. Although not shown in FIG. 3, more than two contact holes may be used to expose the second measuring pad portion Pb2.

When the center portion PP is removed, the removed portion may be filled by the protective layer 180.

The position or the size of the second contact holes 182a and 182b (shape) may be different from the first contact hole 181. One second contact hole 182a may be positioned closer to the end connected to the connection wire 176 among two ends of the second measuring pad portion Pb2, and the other second contact hole 182b may be positioned closer to the opposite side of the second measuring pad portion Pb2. When the center portion PP of the second measuring pad portion Pb2 of the second test region TE2 is removed such that the second measuring pad portion Pb2 is divided into two portions, the second contact holes 182a and 182b may be positioned on the upper portion and the lower portion of the second measuring pad portion Pb2.

When the second measuring pad portion Pb2 of the second test region TE2 has a different size from the other measuring pad portions Pa2, Pc2, and Pd2, a plurality of the second contact holes 182a and 182b may be positioned at a region that does not face the first contact hole 181 in the horizontal direction. For example, as shown in FIG. 3, when extending an upper edge and a lower edge of the first contact hole 181 in the horizontal direction, the second contact holes 182a and 182b may not be positioned between two extending lines.

A plurality of contact assistance members 81 may be positioned on the protective layer 180. The contact assistance members 81 may contact the measuring pad portions Pa2, Pb2, Pc2, and Pd2 of the second test region TE2 through the first contact hole 181 and the second contact holes 182a and 182b. The contact assistance member 81 contacting the second measuring pad portion Pb2 may simultaneously contact a plurality of the second contact holes 182a and 182b.

The vertical direction length H2 of the contact assistance member 81 contacting the second measuring pad portion Pb2 of the second test region TE2 may be longer than the vertical direction length H1 of the contact assistance member 81 contacting the other measuring pad portions Pa2, Pc2, and Pd2 or the contact assistance member 81 contacting the measuring pad portions Pa1, Pb1, Pc1, and Pd1 of the first test region TE1.

The contact assistance members 81 connected to the measuring pad portions Pa2, Pb2, Pc2, and Pd2 may be connected to the driving circuit portion 500. The driving circuit portion 500 may include the circuit board 510, the conductive pattern 550 positioned on the circuit board 510, and the conductive bumps 520 positioned on the conductive pattern 550.

The conductive pattern 550 may electrically connect a plurality of adjacent conductive bumps 520. A portion indicated by a dotted line in FIG. 3 may indicate the measuring pad portions Pa2, Pb2, and Pc2 to be connected to the conductive bumps 520 that may be connected to each other by the conductive pattern 550.

The conductive bumps 520 may be electrically connected to the contact assistance members 81 through the conductive balls 600 of the anisotropic conductive film. As shown in FIG. 5, the conductive bumps 520 may contact the contact assistance members 81 positioned between the two second contact holes 182a and 182b through the conductive balls 600. For example, the conductive bumps 520 may not contact the contact assistance members 81 in the second contact holes 182a and 182b.

The contact resistance between the conductive balls 600 and the conductive bumps 520, the contact resistance between the conductive balls 600 and the contact assistance members 81, and the resistance of the conductive balls 600 may represent the connection resistance at the connection portion.

As shown in FIG. 5, if the resistance between a point A of the conductive pattern 550 and a point B of the contact assistance member 81 is measured, only the connection resistance at the connection portion may be measured.

When measuring the connection resistance at the connection portion, the conductive bump 520 may not be contacted, but may be connected to the contact assistance member 81 at the second contact hole 182a and 182b. Thus, the center portion PP of the measuring pad portion Pb2 of the second test region TE2 may not be omitted.

A method of measuring the resistance at the connection portion of the substrate for the electronic device including the pad portion will be described with reference to FIG. 6 along with the above-described drawings.

Figure 6:
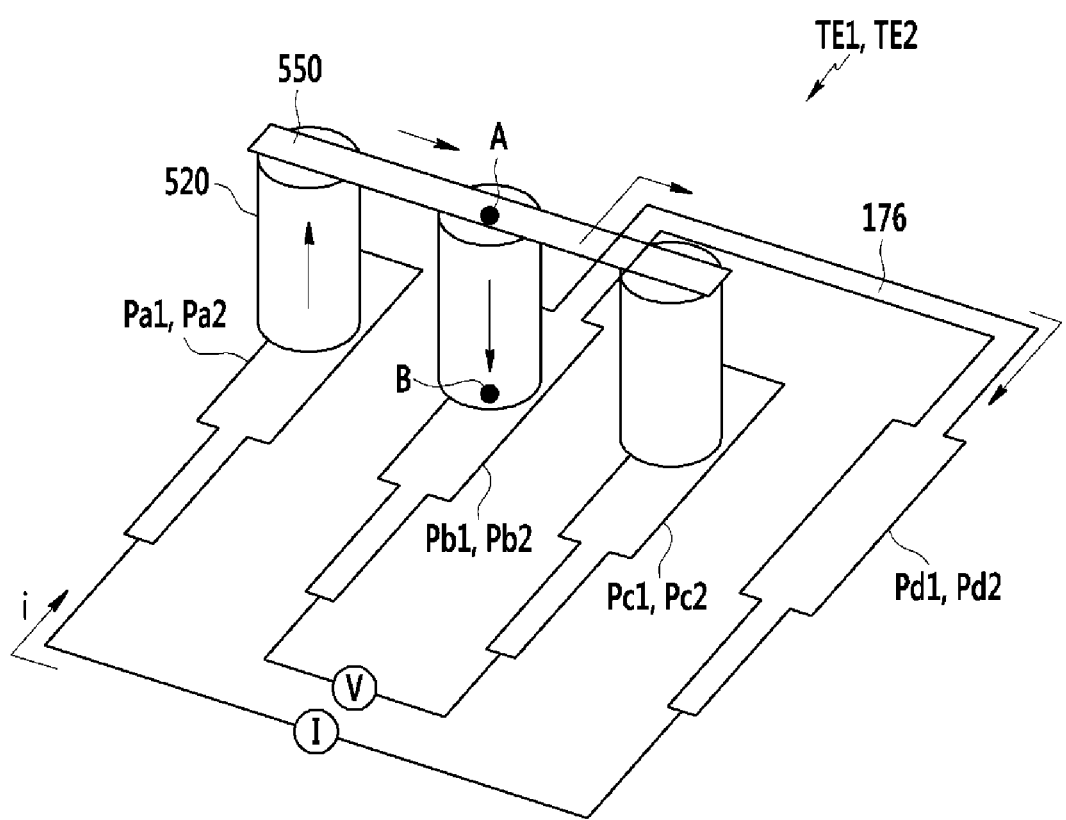
FIG. 6 is a view of a method of measuring resistance at a connection portion of a substrate according to exemplary embodiments of the present invention.

FIG. 6 is a view of a method of measuring a resistance at a connection portion of a substrate.

The methods of measuring resistance of the connection portion at the first test region TE1 and at the second test region TE2 are similar to each other such that they will be described together.

The first probe of the current supplier (I) may be connected to the terminal of the first measuring pad portions Pa1 and Pa2 to inflow a current (i). The second probe of the current supplier (I) may be connected to the terminal of the fourth measuring pad portions Pd1 and Pd2 to be grounded. The current (i) may flow in a sequence of the first measuring pad portions Pa1 and Pa2, the conductive bump 520 of the driving circuit portion 500, the point A of the conductive pattern 550, the conductive bump 520 connected to the point A, the point B, the second measuring pad portions Pb1 and Pb2, the connection wire 176, and the fourth measuring pad portions Pd1 and Pd2.

The third probe of a voltmeter (V) may be connected to the terminal of the second measuring pad portions Pb1 and Pb2. The fourth probe may be connected to the terminal of the third measuring pad portions Pc1 and Pc2 to measure the voltage. The voltage measured by the voltmeter (V) may correspond to a voltage difference between the point A and the point B as a path that the current (i) flows. If the measured voltage difference is divided by the current (i), the resistance between the point A and the point B may be measured.

Referring to FIG. 6 as well as FIG. 2 and FIG. 4, the resistance between the point A and the point B measured at the first test region TE1 will be described. If the current supplier (I) flows the current (i), like an arrow shown in FIG. 4, a path of the current (i) may be generated to a side of the terminal connected to the connection wire 176 among the terminals of the second measuring pad portion Pb1. The terminal to which the third probe of the voltmeter (V) is connected may be the terminal of the opposite side such that the point B may be formed at the second measuring pad portion Pb1 in the connection portion. The voltage measured at the voltmeter (V) may be a voltage between the point A and the point B as the second measuring pad portion Pb1 in the path of the current (i). The resistance measured at the first test region TE1 may be a value including the contact resistance between the multi-layered thin films along with the connection resistance at the connection portion of the second measuring pad portion Pb1.

Referring to FIG. 6, along with FIG. 3 and FIG. 5, the resistance between the point A and the point B at the second test region TE2 will be described. If the current supplier (I) flows the current (i), like an arrow shown in FIG. 5, a path of the current (i) may be generated in the side of the terminal connected to the connection wire 176 among the terminals of the second measuring pad portion Pb2. The terminal to which the third probe of the voltmeter (V) may be connected is the terminal opposite to the voltmeter (V) such that the point B may be formed at the contact assistance member 81 in the connection portion. The voltage measured in the voltmeter (V) may be the voltage between the point A and the point B of the contact assistance member 81 at the connection portion of the second measuring pad portion Pb2 among the path of the current (i). The resistance measured at the second test region TE2 may be a value that includes the connection resistance at the connection portion and may not include the contact resistance between the multi-layered thin films.

The resistance measured in the second test region TE2 may be the connection resistance, and the resistance measured in the first test region TE1 may be the sum of the connection resistance and the contact resistance. According to the measuring method of the resistance, the connection resistance and the contact resistance may be distinguished and correctly measured at the connection portion of the substrate of the electronic device such as the display device and the driving circuit chip or the TCP type film without high-precision analysis equipment such as a SEM, a TEM, and a FIB. The resistance may be correctly determined as a factor of a driving defect of an electronic device is resistance at a connection portion or the kind of resistance the driving defect is due to such that the manufacturing cost and the manufacturing time of the electronic device may be reduced.

Exemplary embodiments of the present invention such as substrate of the electronic device including the pad portion will be described with reference to FIG. 7, FIG. 8, FIG. 9, and FIG. 10 as well as the above-described drawings. The same reference numerals designate the same constituent elements as in the exemplary embodiments described above, and duplicated descriptions are omitted while differences will be mainly described.

FIG. 7, FIG. 8, FIG. 9, and FIG. 10 are top plan views of a pad portion.

Figure 7:
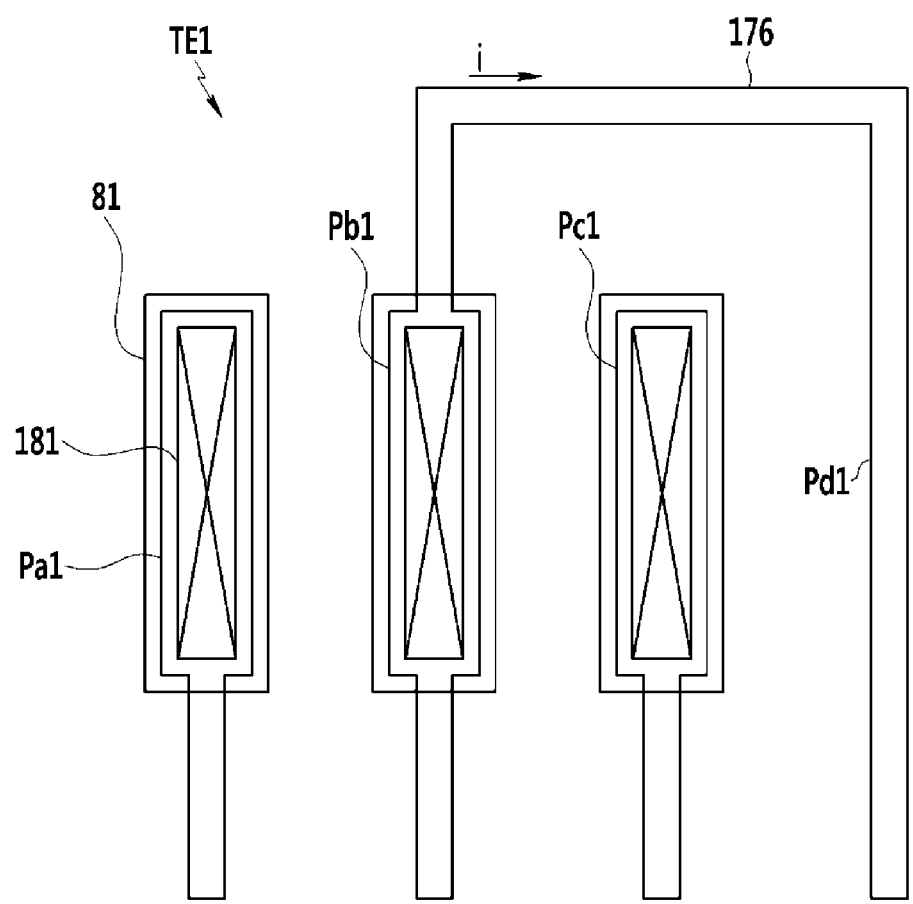
FIG. 7, FIG. 8, FIG. 9, and FIG. 10 are top plan views of a pad portion according to exemplary embodiments of the present invention.

Referring to FIG. 7, the first test region TE1 of the electronic device is the same as most of the exemplary embodiment shown in FIG. 2, however a shape of the fourth measuring pad portion Pd1 may be different. The fourth measuring pad portion Pd1 may not be connected to the conductive bump 520 of the driving circuit portion 500 such that the fourth measuring pad portion Pd1 may have a smaller area than the other measuring pad portions Pa1, Pb1, and Pc1. For example, in FIG. 7, the fourth measuring pad portion Pd1 may be formed with a wire shape.

Figure 8:
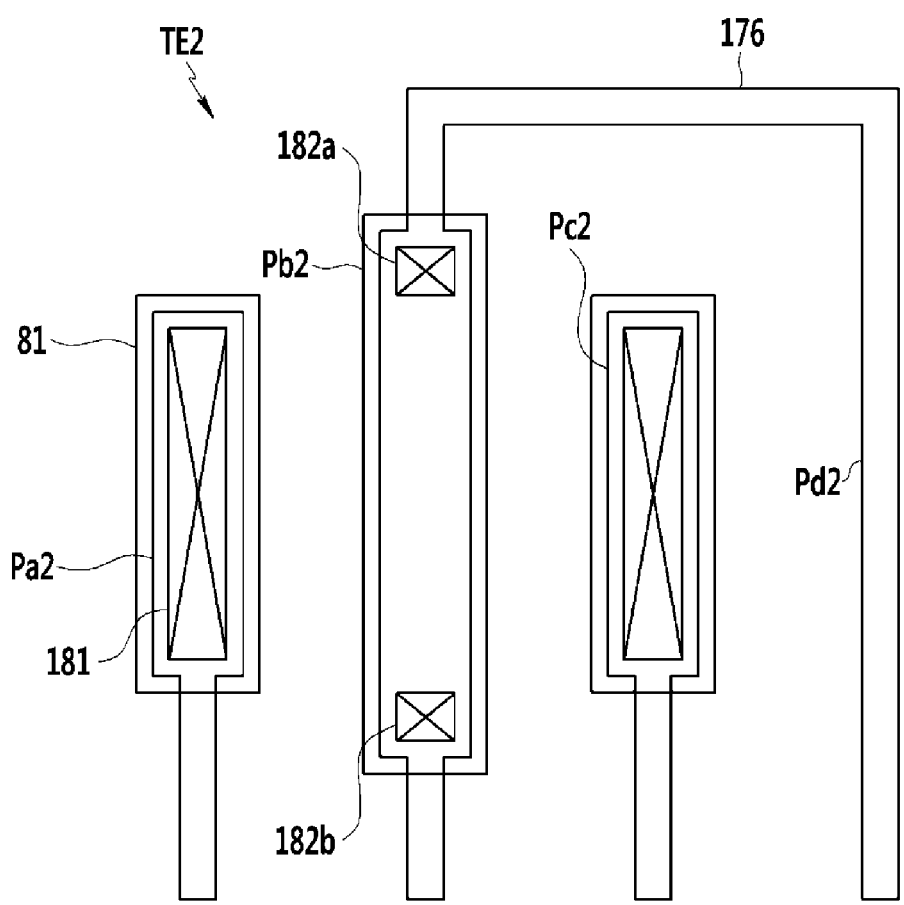

Referring to FIG. 8, the second test region TE2 of the electronic device may be the same as most of the exemplary embodiment shown in FIG. 3, however the shape of the fourth measuring pad portion Pd2 may be different. The fourth measuring pad portion Pd2 may not be connected to the conductive bump 520 of the driving circuit portion 500 such that the fourth measuring pad portion Pd2 may have smaller area than the other measuring pad portions Pa2, Pb2, and Pc2. For example, FIG. 3 shows the fourth measuring pad portion Pd2 is formed with the wire shape.

Figure 9:
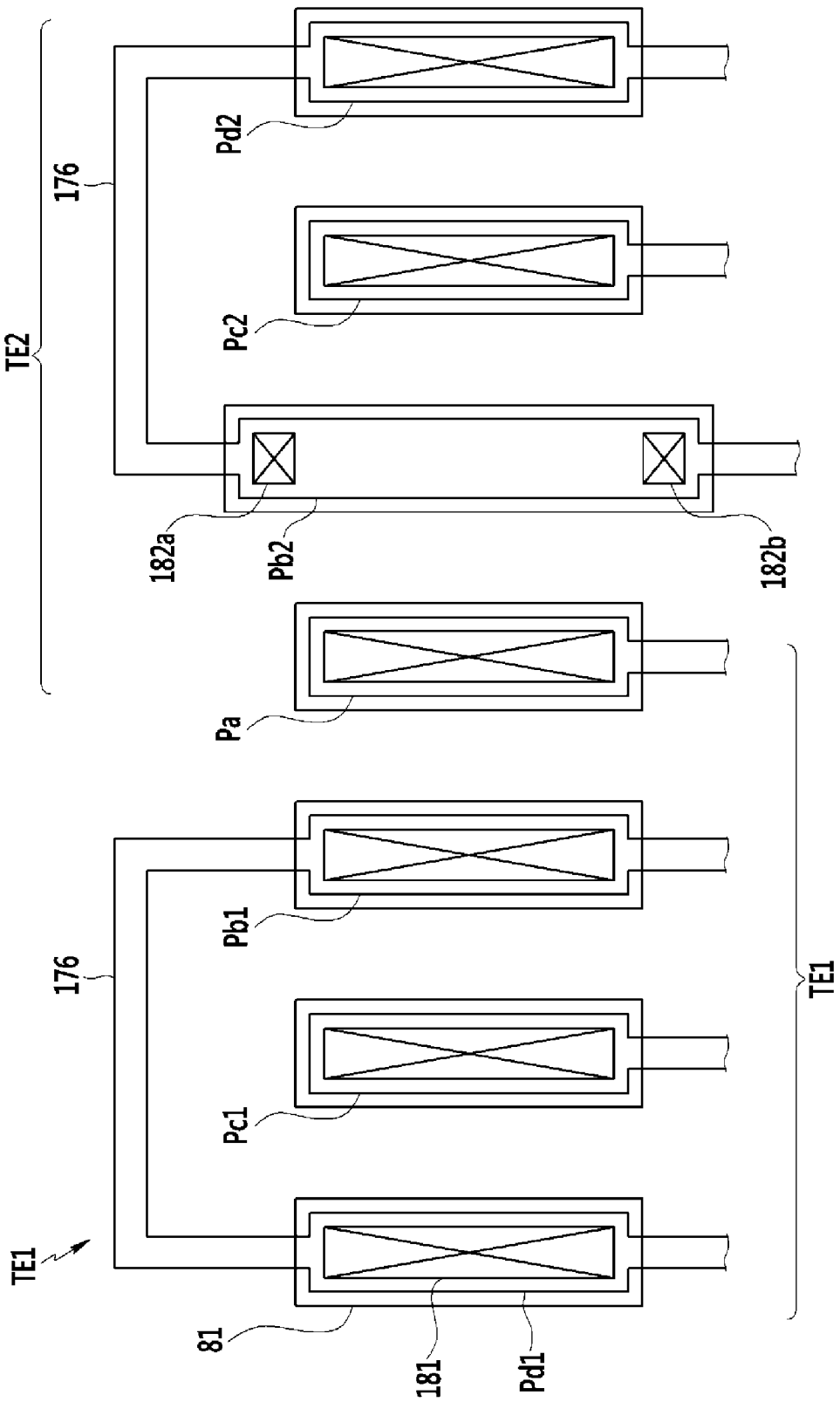

Referring to FIG. 9, a substrate of an electronic device may be the same as most of the exemplary embodiments; however, an arrangement of the first test region TE1 and the second test region TE2 may be different.

The regions of the first test region TE1 and the second test region TE2 may not be divided and may commonly include at least one measuring pad portion. The first measuring pad portion Pa1 of the first test region TE1 and the first measuring pad portion Pa2 of the second test region TE2 may not be separately formed, but may be commonly formed with the first measuring pad portion Pa. For example, the first test region TE1 may include the first measuring pad portion Pa, the second measuring pad portion Pb1, the third measuring pad portion Pc1, and the fourth measuring pad portion Pd1, and the second test region TE2 may include the first measuring pad portion Pa, the second measuring pad portion Pb2, the third measuring pad portion Pc2, and the fourth measuring pad portion Pd2. At the first test region TE1 and the second test region TE2, the first probe of the current supplier (I) may be commonly connected to the terminal of the first measuring pad portion Pa during the resistance measuring of each connection portion.

Figure 10:
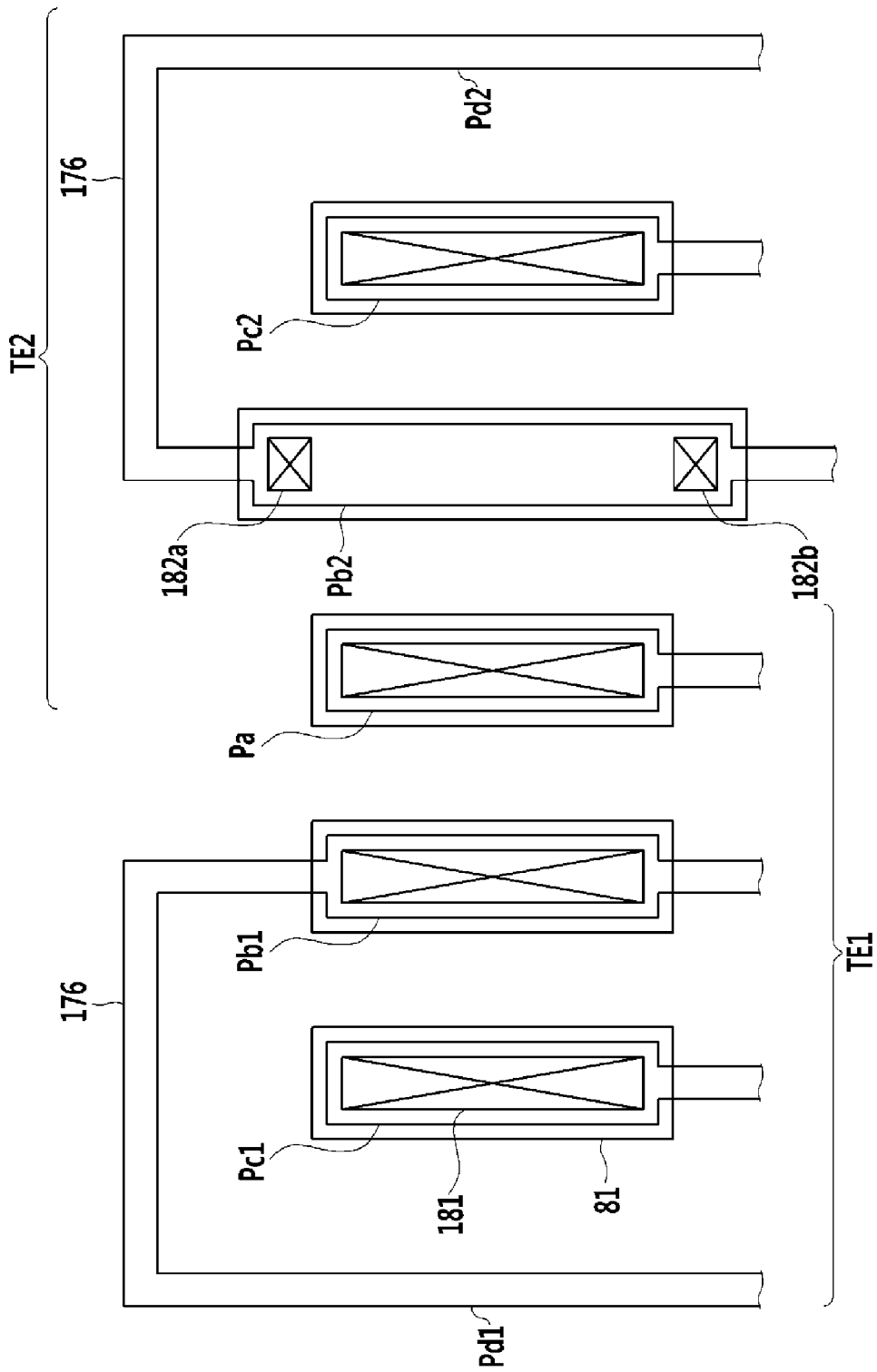

Referring to FIG. 10, a substrate of an electronic device may be the same as most of the exemplary embodiment shown in FIG. 9, however the shape of the fourth measuring pad portion Pd1 and Pd2 may be different. The fourth measuring pad portions Pd1 and Pd2 may not be connected to the conductive bump 520 of the driving circuit portion 500 such that the fourth measuring pad portion Pd1 and Pd2 may have a smaller area than the other measuring pad portions Pa1, Pa2, Pb1, Pb2, Pc1, and Pc2. FIG. 10 shows an example in which the fourth measuring pad portions Pd1 and Pd2 may be formed with a wire shape extended from the connection wire 176, like in FIG. 7.

A method of measuring the resistance at the connection portion of the substrate of the electronic device including the pad portion will be described with reference to FIG. 11 and FIG. 12 as well as the drawings described above.

Figure 11:
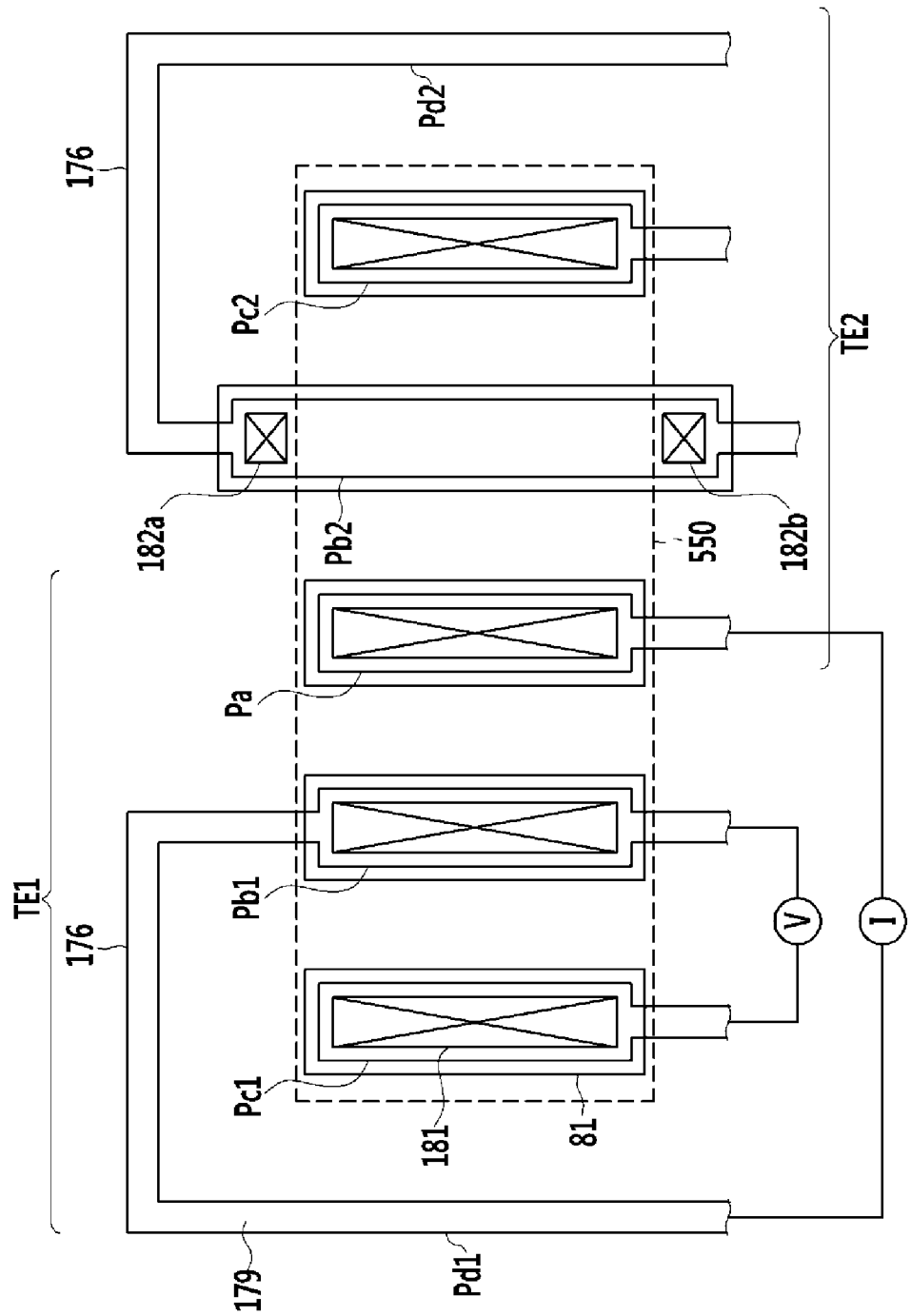
FIG. 11 and FIG. 12 are views showing a method of measuring resistance at a connection portion of a substrate according to exemplary embodiments of the present invention.
Figure 12:
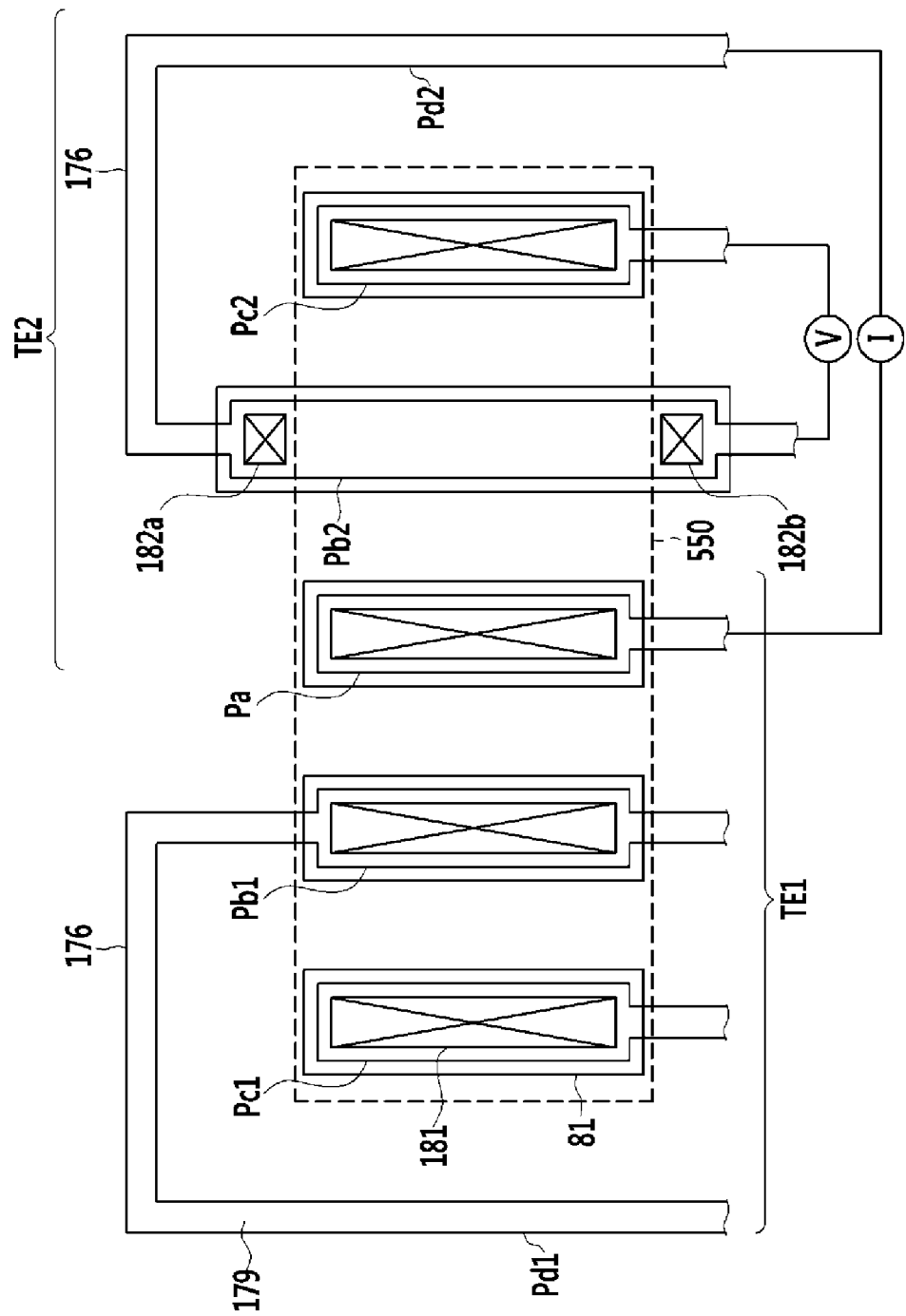

FIG. 11 and FIG. 12 are views showing a method of measuring resistance at a connection portion of a substrate.

The arrangement of the first test region TE1 and the second test region TE2 of the substrate may be the same as that of the several exemplary embodiments shown in FIG. 9 and FIG. 10. FIG. 11 and FIG. 12 show examples of the exemplary embodiments shown in FIG. 10.

If the driving circuit portion 500 is connected to the substrate, as shown in FIG. 11 and FIG. 12, the conductive bumps 520 connected to the measuring pad portions Pa, Pb1, Pb2, Pc1, and Pc2 facing the region of the conductive pattern 550 of the driving circuit portion 500 may be electrically connected to each other.

Referring to FIG. 11, to first measure the resistance of the connection portion of the first test region TE1, the current supplier (I) may be connected between the terminal of the first measuring pad portion Pa and the terminal of the fourth measuring pad portion Pd1. The voltmeter (V) may be connected between the terminal of the second measuring pad portion Pb1 and the terminal of the third measuring pad portion Pc1 to measure the voltage and to measure the connection resistance and the contact resistance at the connection portion of the second measuring pad portion Pb1.

Referring to FIG. 12, after the resistance measuring at the first test region TE1, to measure the resistance of the connection portion of the second test region TE2 by the same method, the current supplier (I) may be connected between the terminal of the first measuring pad portion Pa and the terminal of the fourth measuring pad portion Pd2. The voltmeter (V) may be connected between the terminal of the second measuring pad portion Pb2 and the terminal of the third measuring pad portion Pc2 to measure the voltage and to measure the connection resistance at the connection portion of the second measuring pad portion Pb2.

The order of the resistance measuring at the first test region TE1 and the resistance measuring at the second test region TE2 may be exchanged.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A substrate of an electronic device, comprising:
a first test region and a second test region to measure resistance at a connection portion for connection to a driving circuit portion,
wherein the first test region and the second test region each comprise:
a plurality of measuring pad portions;
a protective layer disposed on the plurality of measuring pad portions; and
a contact assistance member disposed on the protective layer,
wherein the protective layer in the first test region comprises first contact holes respectively exposing the plurality of measuring pad portions, and the contact assistance member in the first test region contacts a measuring pad portion through a first contact hole, and
wherein the protective layer in the second test region comprises two second contact holes exposing one measuring pad portion among the plurality of measuring pad portions, and the contact assistance member in the second test region contacts the one measuring pad portion exposed through the two second contact holes.

2. The substrate of claim 1, wherein:
a position of the first contact hole with respect to the measuring pad portion exposed by the first contact hole is different from a position of the second contact hole with respect to the measuring pad portion exposed by the second contact hole.

3. The substrate of claim 2, wherein:
the two second contact holes are disposed on opposite ends of the one measuring pad portion.

4. The substrate of claim 3, wherein:
the first test region comprises a first measuring pad portion, a second measuring pad portion, a third measuring pad portion, and a fourth measuring pad portion that are separated from each other;
one terminal of the second measuring pad portion is connected to one terminal of the fourth measuring pad portion by a first connector; and
the first contact hole is disposed on the second measuring pad portion in the first test region.

5. The substrate of claim 4, wherein:
the second test region comprises a fifth measuring pad portion, a sixth measuring pad portion, a seventh measuring pad portion, and an eighth measuring pad portion;
one terminal of the sixth measuring pad portion is connected to one terminal of the eighth measuring pad portion by a second connector; and
the two second contact holes are disposed on the sixth measuring pad portion in the second test region.

6. The substrate of claim 5, wherein:
the sixth measuring pad portion comprises two portions that are spaced apart from each other; and
the two second contact holes respectively expose the two portions of the sixth measuring pad portion.

7. The substrate of claim 6, wherein:
the first measuring pad portion in the first test region forms the fifth measuring pad portion in the second test region.

8. An electronic device, comprising:
a substrate comprising a first test region and a second test region to measure resistance at a connection portion; and
a driving circuit portion comprising a plurality of conductive bumps and a conductive pattern connected to the conductive bumps, the driving circuit portion being connected to the connection portion,
wherein the first test region and the second test region each comprise:
a plurality of measuring pad portions;
a protective layer disposed on the plurality of measuring pad portions; and
a contact assistance member disposed on the protective layer,
wherein the protective layer in the first test region comprises first contact holes respectively exposing at least one measuring pad portion among the plurality of measuring pad portions, and the contact assistance member in the first test region contacts a measuring pad portion through a first contact hole, and
wherein the protective layer in the second test region comprises two second contact holes exposing one measuring pad portion among the plurality of measuring pad portions, and the contact assistance member of the second test region contacts the one measuring pad portion through the two second contact holes.

9. The electronic device of claim 8, wherein:
a position of the first contact hole with respect to the measuring pad portion exposed by the first contact hole is different from a position of the second contact hole with respect to the measuring pad portion exposed by the second contact hole.

10. The electronic device of claim 9, wherein:
the two second contact holes disposed at opposite ends of the one measuring pad portion.

11. The electronic device of claim 10, wherein:
the first test region comprises a first measuring pad portion, a second measuring pad portion, a third measuring pad portion, and a fourth measuring pad portion that are separated from each other;
one terminal of the second measuring pad portion is connected to one terminal of the fourth measuring pad portion by a first connector; and
the first contact hole is disposed on the second measuring pad portion in the first test region.

12. The electronic device of claim 11, wherein:
the second test region comprises a fifth measuring pad portion, a sixth measuring pad portion, a seventh measuring pad portion, and an eighth measuring pad portion;
one terminal of the sixth measuring pad portion is connected to one terminal of the eighth measuring pad portion by a second connector; and
the two second contact holes are disposed on the sixth measuring pad portion in the second test region.

13. The electronic device of claim 12, wherein:
the conductive bumps of the driving circuit portion are electrically connected to the first, second, and third measuring pad portions in the first test region, and are electrically connected to each other by the conductive pattern; and
the conductive bumps of the driving circuit portion are electrically connected to the fifth, sixth, and seventh measuring pad portions in the second test region, and are electrically connected to each other by the conductive pattern.

14. The electronic device of claim 13, further comprising:
an anisotropic conductive film disposed between the conductive bump and the contact assistance member and comprising conductive balls.

15. The electronic device of claim 14, wherein:
the conductive balls of the first test region contact the contact assistance member in the first contact hole; and the conductive balls of the second test region contact the contact assistance member between the two second contact holes.

16. The electronic device of claim 12, wherein:
the sixth measuring pad portion comprises two portions that are spaced apart from each other; and
the two second contact holes respectively expose the two portions of the sixth measuring pad portion.

17. The electronic device of claim 12, wherein:
the first measuring pad portion in the first test region forms the sixth measuring pad portion in the second test region.

18. A method of measuring a resistance at a connection portion, comprising:
connecting a driving circuit portion to a connection portion of a substrate comprising a first test region and a second test region;
supplying a current to the first test region and measuring a voltage to measure a first resistance, the first resistance comprising a sum of a contact resistance between thin films of the connection portion and a connection resistance of the driving circuit portion; and
supplying a current to the second test region and measuring a voltage to measure a second resistance, the second resistance comprising the connection resistance of the driving circuit portion.

19. The method of claim 18, wherein the first test region and the second test region each comprise:
a plurality of measuring pad portions;
a protective layer disposed on the plurality of measuring pad portions; and
a contact assistance member disposed on the protective layer,
wherein the protective layer in the first test region comprises a first contact holes respectively exposing at least one measuring pad portion among the plurality of measuring pad portions, and the contact assistance member in the first test region contacts a measuring pad portion through a first contact hole, and
wherein the protective layer in the second test region comprises two second contact holes exposing one measuring pad portion among the plurality of measuring pad portions, and the contact assistance member of the second test region contacts the one measuring pad portion through the two second contact holes.

20. The method of claim 19, wherein:
a position of the first contact hole with respect to the measuring pad portion exposed by the first contact hole is different from a position of the second contact hole with respect to the measuring pad portion exposed by the second contact hole.

21. The method of claim 20, wherein:
the driving circuit portion comprises a plurality of conductive bumps and a conductive pattern connected to the conductive bumps; and
the connecting of the driving circuit portion to the connection portion of the substrate comprises disposing an anisotropic conductive film comprising conductive balls between the conductive bump and the contact assistance member.

22. The method of claim 21, wherein:
the first test region comprises a first measuring pad portion, a second measuring pad portion, a third measuring pad portion, and a fourth measuring pad portion that are separated from each other;
one terminal of the second measuring pad portion is connected to one terminal of the fourth measuring pad portion by a first connector;
the first contact hole is disposed on the second measuring pad portion in the first test region;
the second test region comprises a fifth measuring pad portion, a sixth measuring pad portion, a seventh measuring pad portion, and an eighth measuring pad portion;
one terminal of the sixth measuring pad portion is connected to one terminal of the eighth measuring pad portion by a second connector; and
the two second contact holes are disposed on the sixth measuring pad portion in the second test region.

23. The method of claim 22, wherein measuring the first resistance comprises:
connecting a current supplier between the first measuring pad portion and the fourth measuring pad portion; and
connecting a voltmeter between the second measuring pad portion and the third measuring pad portion,
wherein the first resistance corresponds to a resistance between the second measuring pad portion and the conductive pattern.

24. The method of claim 23, wherein measuring the second resistance comprises:
connecting a current supplier between the fifth measuring pad portion and the eighth measuring pad portion; and
connecting a voltmeter between the sixth measuring pad portion and the seventh measuring pad portion, and
wherein the second resistance corresponds to a resistance between the contact assistance member contacting the sixth measuring pad portion and the conductive pattern.

25. The method of claim 22, wherein:
the conductive balls of the first test region contact the contact assistance member in the first contact hole; and
the conductive balls of the second test region contact the contact assistance member between the two second contact holes.

26. The method of claim 22, wherein:
the sixth measuring pad portion comprises two portions that are spaced apart from each other; and
the two second contact holes respectively expose the two portions of the sixth measuring pad portion.

27. The method of claim 22, wherein:
the first measuring pad portion in the first test region forms the sixth measuring pad portion in the second test region.

* * * * *